(12) United States Patent
Chang et al.

(10) Patent No.: US 7,609,191 B2
(45) Date of Patent: *Oct. 27, 2009

(54) DIGITAL/ANALOG CONVERTING DRIVER AND METHOD

(75) Inventors: Il-Kwon Chang, Gimpo-si (KR); Yong-Weon Jeon, Suwon-si (KR); Ji-Woon Jung, Gwangmyeong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 409 days.

This patent is subject to a terminal disclaimer.

(21) Appl. No.: 11/556,729

(22) Filed: Nov. 6, 2006

(65) Prior Publication Data

US 2008/0309538 A1  Dec. 18, 2008

(30) Foreign Application Priority Data

Nov. 5, 2005 (KR) ............... 10-2005-0105729
Nov. 17, 2005 (KR) ............... 10-2005-0110121

(51) Int. Cl.
*H03M 1/68* (2006.01)

(52) U.S. Cl. .................. 341/145; 345/690
(58) Field of Classification Search .......... 341/145
See application file for complete search history.

(56) References Cited

U.S. PATENT DOCUMENTS

| | | | | |
|---|---|---|---|---|
| 4,873,525 A | * | 10/1989 | Iida | 341/145 |
| 5,469,164 A | * | 11/1995 | Kemp | 341/145 |
| 5,914,682 A | * | 6/1999 | Noguchi | 341/145 |
| 6,509,856 B2 | * | 1/2003 | Noro et al. | 341/144 |
| 7,286,071 B1 | * | 10/2007 | Hsueh et al. | 341/145 |
| 7,453,386 B2 | * | 11/2008 | Jeon et al. | 341/145 |
| 2002/0140595 A1 | * | 10/2002 | Karube | 341/150 |
| 2008/0024478 A1 | * | 1/2008 | Yoshioka et al. | 341/145 |

FOREIGN PATENT DOCUMENTS

| | | |
|---|---|---|
| JP | 06-152416 | 5/1994 |
| JP | 07-321656 | 12/1995 |
| JP | 09-214344 | 8/1997 |
| JP | 2001-177410 | 6/2001 |
| KR | 1020010095167 A | 11/2001 |

* cited by examiner

*Primary Examiner*—Howard Williams
(74) *Attorney, Agent, or Firm*—F. Chau & Assoc., LLC

(57) ABSTRACT

A digital/analog converting driver and a digital/analog converting method, in which the digital/analog converting driver converts digital data having M+N (M and N are integers) bits into an analog voltage and includes a first converting unit, a second converting unit, and an analog voltage outputting unit. The first converting unit converts successive M bits of the digital data into a first voltage. The second converting unit converts successive N bits of the digital data into a second voltage. The analog voltage outputting unit adds the first voltage and the second voltage and outputs the added voltage as the analog voltage. The output range of the first voltage is different from that of the second voltage.

27 Claims, 10 Drawing Sheets

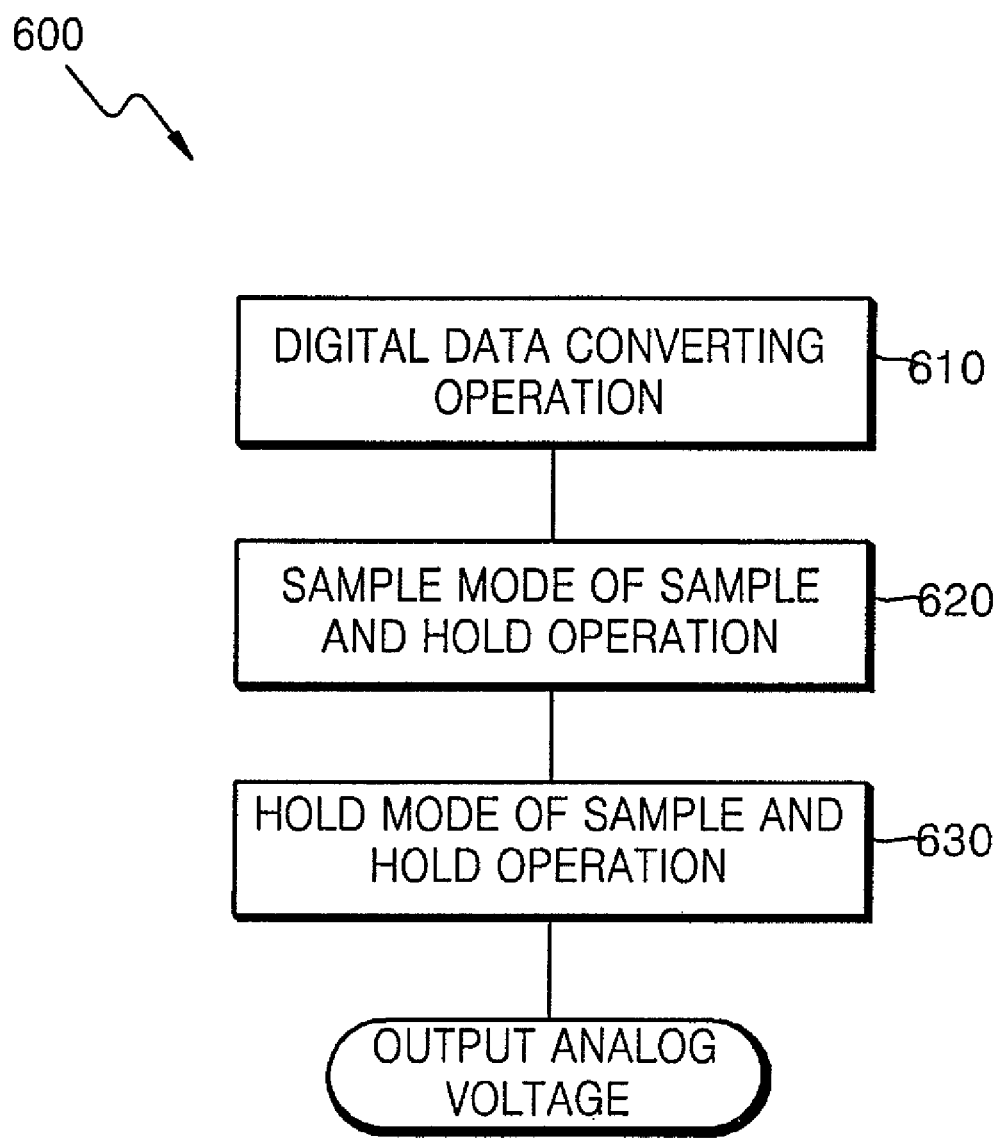

DIGITAL/ANALOG CONVERTING DRIVER AND METHOD

CROSS-REFERENCE TO RELATED PATENT APPLICATIONS

This application claims the benefit of Korean Patent Application No. 10-2005-0105729, filed on Nov. 5, 2005 and 10-2005-0110121, filed on 17 Nov. 2005 in the Korean Intellectual Property Office, the disclosures of which are incorporated herein in their entirety by reference.

BACKGROUND OF THE INVENTION

1. Technical Field

The present disclosure relates to a digital/analog converting driver and, more particularly, to a digital/analog converting driver including a resistor string converter and a capacitor converter.

2. Discussion of the Related Art

Recently, as the size of a display panel such as used in a television is being increased, the number of digital/analog converters necessary for driving the panel in a source driver IC is also increasing.

Accordingly, as the semiconductor chip area of the digital/analog converter increases, the chip area of the source driver in the display device also increases. This problem seems to be more serious in a 10-bit system for displaying high definition television signals.

FIG. 1 schematically illustrates a conventional resistor string digital/analog converter.

Referring to FIG. 1, the conventional resistor string digital/analog converter 10, hereinafter, referred to as a "resistor string converter, includes a resistor string 12 and a decoder 14.

When the bit number of the digital data DTA input to the resistor string converter 10 is n, the resistor string 12 includes $2^n-1$ resistors R1, R2, ..., and $R2^n-1$ which are connected in series. A maximum voltage $V_{max}$ and a minimum voltage $V_{min}$ are applied across the resistor string 12.

The respective voltages $V_{i1}, V_{i2}, \ldots,$ and $V_{ik}$ across the resistors R1, R2, ..., and $R2^n-1$ have voltages between the maximum voltage $V_{max}$ and the minimum voltage $V_{min}$.

The decoder 14 receives the digital data DTA and selects and outputs a voltage corresponding to the received digital data DTA from the voltages $V_{i1}, V_{i2}, \ldots,$ and $V_{ik}$ of the resistor string 12.

The voltages $V_{o1}, V_{o2}, \ldots,$ and $V_{ok}$ selected by the decoder 14 are supplied to an external device through respective buffers in a buffer unit 20 as analog voltages.

The conventional resistor string converter of FIG. 1 can perform a stable digital/analog converting function. Whenever the bit number of the digital data increases one by one, however, the chip area of the conventional resistor string converter increases by two times.

For example, if the size of a decoder in a 6-bit system is 100, the size of a decoder in an 8-bit system is 400 ($100 \times 2^2$). Similarly, the size of a decoder in a 10-bit system is 1600 ($100 \times 2^4$) and the size of a decoder in a 12-bit system is 3200($100 \times 2^6$).

Accordingly, the resistor string converter is not suitable for a high level of integration and cannot be used in the 10-bit system, for example.

In order to address this problem, a capacitor digital/analog converter, hereinafter, referred to as capacitor converter has been proposed.

FIG. 2 is a circuit diagram illustrating a conventional capacitor converter.

Referring to FIG. 2, the conventional capacitor converter 30 includes an inputting unit 32 and a converting unit 34.

The inputting unit 32 includes switches Sd1 and Sd2, and selects reference voltage Va or Vb according to the logical level of a bit in the input digital data DTA and outputs the selected reference voltage to the converting unit 34.

The converting unit 34 includes a first capacitor C1, a second capacitor C2, and switches Sc1, Sc2, and Sc3. The converting unit 34 repeatedly performs charging and charge distributing operations and outputs an analog voltage V0 having a level corresponding to the input digital data DTA.

The capacitor converter 30 operates as follows.

First, an initial switch Sc3 discharges the first capacitor C1 and the second capacitor C2 prior to conversion. The inputting unit 32 outputs either one of the reference voltages Va or Vb to the converting unit 34 according to the logical level of a first bit of the input digital data DTA.

A charging switch Sc1 is closed so that the first capacitor C1 is charged by the reference voltage Va or Vb output from the inputting unit 32.

Next, the charging switch Sc1 is opened and a distribution switch Sc2 is closed such that the charges stored in the first capacitor C1 are distributed to the second capacitor C2. At this time, the first capacitor C1 and the second capacitor C2 have the same voltage Va/2 or Vb/2.

Next, the first capacitor C1 is charged by any one of the reference voltages Va and Vb according to the logical level of a second bit of the digital data DTA and the charges are then distributed to the first capacitor C1 and the second capacitor C2.

When digital data having n bits is used, the above processes are performed n times and, thus, an analog voltage Vo having a level corresponding to the input digital data DTA is generated.

Since the conventional capacitor converter includes only a predetermined number of switches and two capacitors regardless of bit number of the digital data, the area thereof is reduced relative to that of the resistor string converter.

When the 10-bit system is composed of the capacitor converter, the area thereof is the same as that of the 6-bit system composed of the resistor string converter.

Since the capacitor converter generates a desired analog voltage through charge distribution from a least significant bit to a most significant bit in the digital data as described above, however, an error may be generated when decoding the most significant bit.

More specifically, if only the logical level of the most significant bit is different from that of the other bits, such as "01111111" or "10000000", the error probability will be increased.

Referring back to FIG. 2, suppose that the reference voltages Va and Vb of the capacitor converter 30 are 5 V and 0 V, respectively, and the digital data DTA is "01111111" (the least significant bit is the first bit to be input).

The charging and distributing operations of the first capacitor C1 and the second capacitor C2 are performed by the logical level "1" of the first bit of the digital data DTA (the least significant bit is the first bit to be input) and, thus, the analog voltage Vo becomes 2.5 V.

Next, when the voltage of 5 V is input according to the logical level "1" of a second bit of "101111111", the voltage division between the first capacitor C1 having 5 V and the second capacitor C2 having 2.5 V are performed and, thus, the analog voltage Vo becomes 3.75 V.

The above process is repeatedly performed. Thereafter, when decoding the logical level "1" of an n−1$^{th}$ bit, a voltage close to the reference voltage (5 V) is output. In other words, after an n−1$^{th}$ converting process, the second capacitor C2 is charged by a voltage close to the maximum Va, which is 5 V.

When the first capacitor C1 is charged by the reference voltage (0 V) according to the logical level "0" of an n$^{th}$ bit and the voltage division between the first capacitor C1 and the second capacitor C2 is performed, however, a switching error is typically generated due to a large voltage difference between the capacitors C1 and C2.

Since the switching error is generated when converting the most significant bit for generating a final analog voltage corresponding to the digital data, the error probability is large. As the bit number of the digital data increases, the voltage difference between the capacitors C1 and C2 increases. Thus, the error probability increases even further.

According to the conventional capacitor converter as the bit number of the digital data increases, the error generation frequency also increases. Thus, it is impossible to ensure stability of a multi-bit system using the conventional capacitor converter.

SUMMARY OF THE INVENTION

Exemplary embodiments of the present invention provide a digital/analog converting driver that can increase area efficiency while ensuring operating accuracy and stability.

Exemplary embodiments of the present invention provide a digital/analog converting method that can increase area efficiency while ensuring operating stability.

Exemplary embodiments of the present invention provide a digital/analog converting driver that includes a sample-and-hold unit that can select different voltages in a sample mode and a hold mode.

Exemplary embodiments of the present invention provide a digital/analog converting method that includes a sample-and-hold operation that can select different voltages in a sample mode and in a hold mode.

According to an exemplary embodiment of the present invention there is provided a digital/analog converting driver that is a combination of a resistor string converter and a capacitor converter and that converts digital data having M+N (M and N are integers) bits into an analog voltage. The digital/analog converting driver includes a first converting unit, a second converting unit, and an analog voltage outputting unit. The first converting unit converts successive M bits of the digital data into a first voltage. The second converting unit converts successive N bits of the digital data into a second voltage. The analog voltage outputting unit adds the first voltage and the second voltage and outputs the added voltage as the analog voltage.

The output range of the first voltage is different from that of the second voltage.

The M bits may be lower M bits of the digital data, and the N bits may be upper N bits of the digital data.

The output range of the first voltage may be smaller than that of the second voltage. The first converting unit and the second converting unit may be different kinds of digital/analog converters.

The first converting unit may be a capacitor converter and the second converter may be a resistor string converter. The capacitor converter may include an inputting unit and a converting unit. The inputting unit may include switches and can output an upper or lower reference voltage corresponding to the logical level of the successive M bits of the digital data The converting unit of the first converting unit may include a first capacitor, a second capacitor, and switches, and can output the first voltage by performing charging and dividing operations by the upper or lower reference voltage received from the inputting unit.

The resistor string converter may include a resistor string and a decoder.

The resistor string may include a plurality of resistors arranged in a line and having respective reference voltages. The decoder may output one of the reference voltages corresponding to the successive N bits of the digital data as the second voltage.

A difference between the upper and lower reference voltages of the capacitor converter may be the same as a difference between the adjacent reference voltages of the resistor string converter. The first capacitor and the second capacitor may have the same capacitance.

The resistor string may include $2^N$ resistors.

The analog voltage outputting unit may be a buffer. The buffer may include an operational amplifier and a switch. The operational amplifier may include an inverting terminal connected to one end of the second capacitor and a non-inverting terminal that receives the second voltage, and an output terminal connected to the other end of the second capacitor and outputs the analog voltage. The switch may be connected to the output terminal and the inverting terminal of the operational amplifier.

As an example, when M+N is 10, M may be 7 and N may be 3. When M+N is 12, M may be 8 and N may be 4.

The digital/analog converting driver may further include a data dividing unit that divides the digital data into the M bits and the N bits and supplies the M bits and the N bits to the first converting unit and the second converting unit, respectively.

According to an exemplary embodiment of the present invention, there is provided a digital/analog converting method including the steps of inputting digital data having M+N bits to a digital/analog converting driver; dividing the digital data by the M bits and the N bits; converting the M bits and the N bits into corresponding voltages; adding the converted voltages; and outputting the added voltage as an analog voltage.

In the converting of the bits, the M bits and the N bits may be converted using different converting methods. The M bits are the upper M bits of the digital is data and the N bits are the tower N bits of the digital data.

In the converting of the bits, the M bits may be converted using a capacitor converter and the N bits may be converted using a resistor string converter.

In the converting of the bits, the output ranges of the voltages corresponding to the M bits and the N bits may be different from one another.

For example, M may be 7 and N may be 3, or M may be 8 and N may be 4.

According to an exemplary embodiment of the present invention, there is provided a digital/analog converting driver that converts digital data having M+N (M and N are integers) bits into an analog voltage. The digital/analog converting driver includes a first converting unit, a second converting unit, and a sample-and-hold unit.

The first converting unit converts M bits of the digital data into a first voltage. The second converting unit converts N bits of the digital data into a second voltage. The sample-and-hold unit samples the second voltage in a sample mode, and outputs the analog voltage by adding the first voltage and the second voltage in a hold mode.

The sample-and-hold unit may receive an initial reference voltage and sample the second voltage in the sample mode, the sample-and-hold unit may receive the first voltage and output the analog voltage in the hold mode. Here, the initial reference voltage and the first voltage may have different voltage levels.

The digital/analog converting driver may further include a voltage selecting unit. The voltage selecting unit may receive the first voltage from the first converting unit and selectively output the initial reference voltage or the first voltage to the sample-and-hold unit.

An interval between the voltage levels of the first voltage may be different from an interval between the voltage levels of the second voltage. The interval between the voltage levels of the first voltage may be smaller than the interval between the voltage levels of the second voltage.

The M bits may be lower M bits of the digital data and the N bits may be upper N bits of the digital data.

The first converting unit may be a resistor string converter that includes a plurality of resistors connected in series and having the same resistance. The second converting unit may be a resistor string converter that includes a plurality of resistors connected in series and the same resistance.

The first converting unit may include $2^M$ resistors connected in series between the first reference voltage and the initial reference voltage, the second converting unit may include $2^N$ resistors connected in series between the second reference voltage and the initial reference voltage, and the second reference voltage may be $2^N$ times the first reference voltage.

According to an exemplary embodiment of the present invention, there is provided a digital/analog converting driver that converts digital data having M+N (M and N are integers) bits into an analog voltage. The digital/analog converting driver includes a first converting unit, a second converting unit, and an analog voltage outputting unit. The first converting unit converts successive M bits of the digital data into a first voltage. The second converting unit converts successive N bits of the digital data into a second voltage. The analog voltage outputting unit adds the first voltage and the second voltage and outputs the added voltage as the analog voltage. Here, an interval between the voltage levels of the first voltage may be different from an interval between the voltage levels of the second voltage.

The interval between the voltage levels of the first voltage may be smaller than the interval between the voltage levels of the second voltage. The M bits may be lower M bits of the digital data and the N bits may be upper N bits of the digital data.

According to an exemplary embodiment of the present invention, there is provided a digital/analog converting method that converts digital data having M+N (M and N are integers) bits into an analog voltage. The digital/analog converting method includes a first converting operation, a second converting operations and a sample-and-hold operation. In the first converting operation M bits of the digital data are converted into a first voltage. In the second converting unit, N bits of the digital data are converted into a second voltage. In the sample-and-hold operation, the second voltage is sampled in a sample mode, the first voltage and the second voltage are added in a hold mode, and the analog voltage is output.

BRIEF DESCRIPTION OF THE DRAWINGS

Exemplary embodiments of the present invention will be understood in more detail from the following descriptions taken in conjunction with the attached drawings in which:

FIG. 12 is a flowchart illustrating a digital/analog converting method according to an exemplary embodiment of the present invention.

DETAILED DESCRIPTION OF EXEMPLARY EMBODIMENTS

Figure 1:
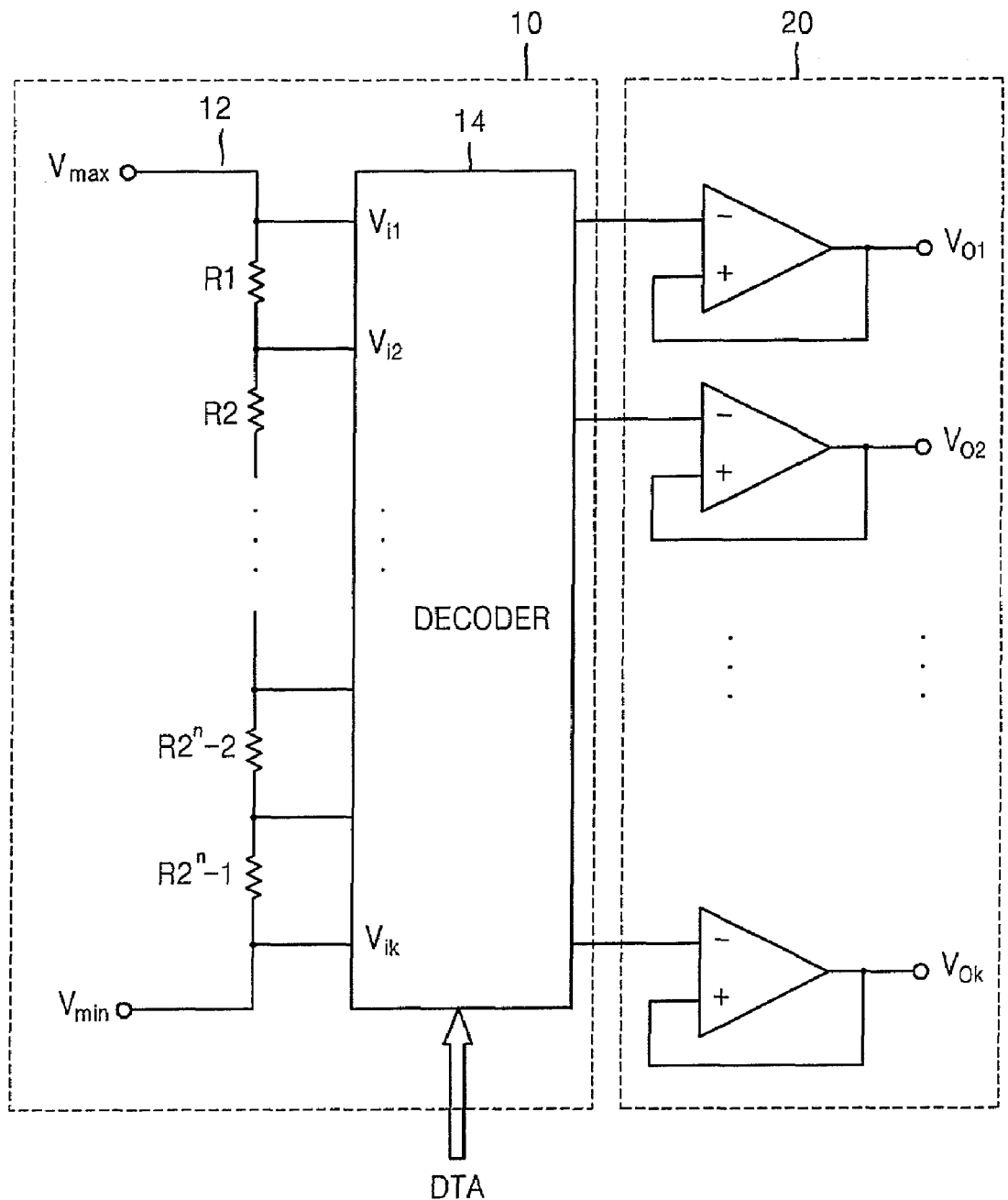
FIG. 1 schematically illustrates a conventional resistor string digital/analog converter.
Figure 2:
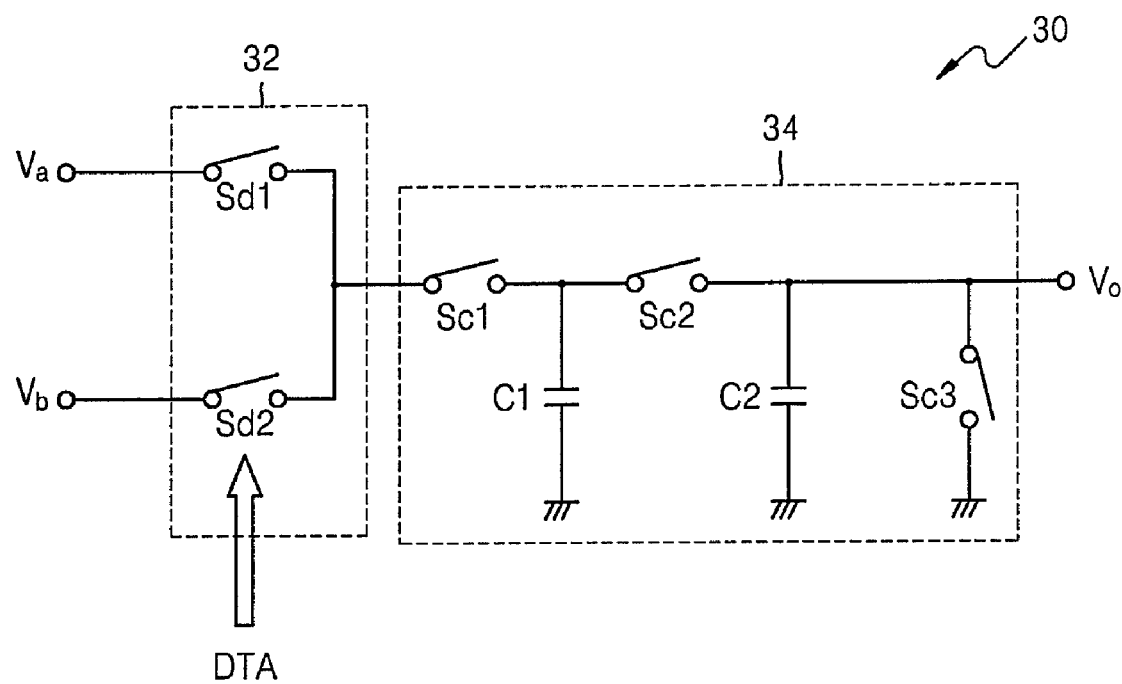
FIG. 2 is a circuit diagram illustrating a conventional capacitor digital/analog converter.

The attached drawings for illustrating exemplary embodiments of the present invention are referred to in order to gain a sufficient understanding of the present invention, the merits thereof and the objectives accomplished by the implementation of the present invention.

Hereinafter, the present invention will be described in detail by explaining exemplary embodiments of the invention with reference to the attached drawings, Like reference numerals in the drawings denote like elements.

Figure 3:
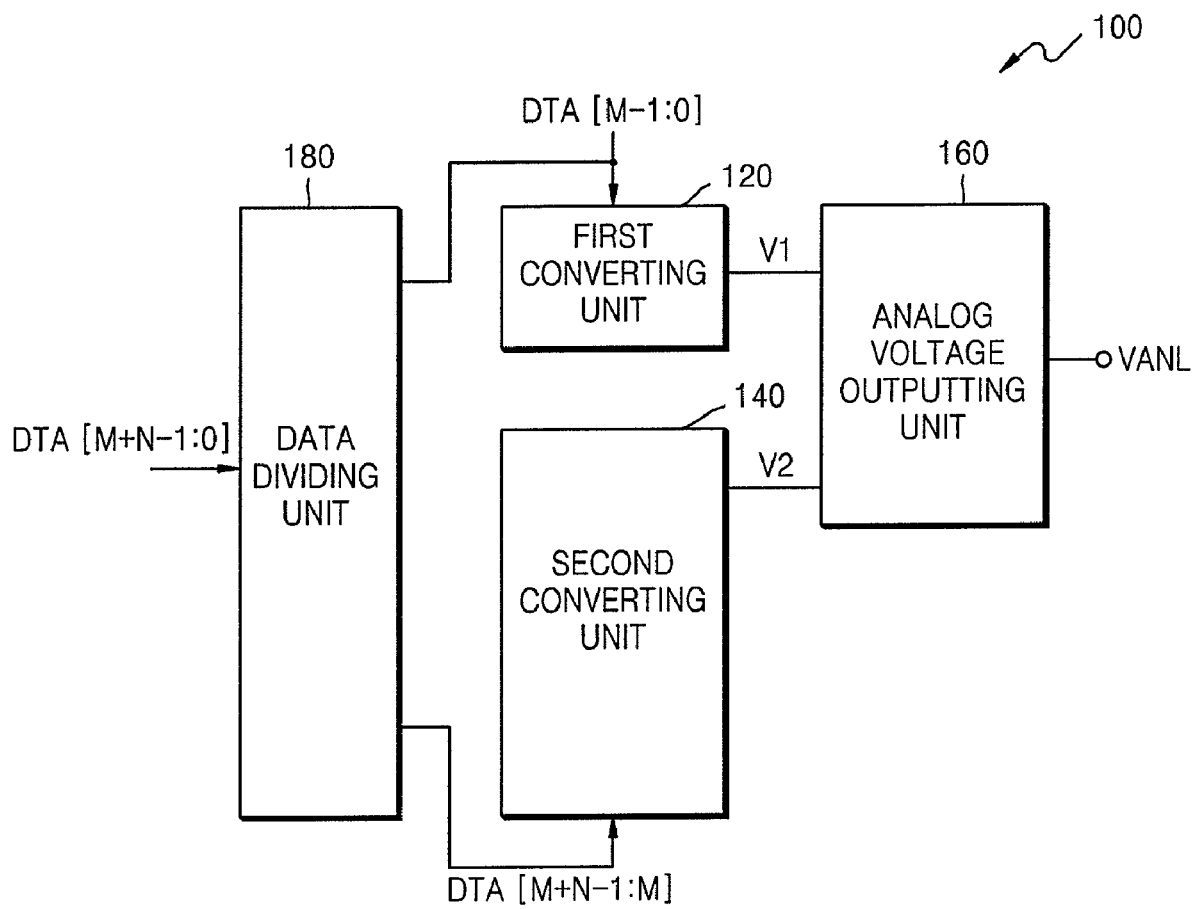
FIG. 3 schematically illustrates a digital/analog converting driver according to an exemplary embodiment of the present invention.

FIG. 3 schematically illustrates a digital/analog converting driver according to an exemplary embodiment of the present invention.

Referring to FIG. 3, a digital/analog converting driver 100 receives digital data having M+N bits and converts the digital data into an analog voltage, and includes a first converting unit 120, a second converting unit 140, and an analog voltage outputting unit 160.

The first converting unit 120 converts successive M bits of the digital data DTA into a first voltage V1. The second converting unit 140 converts successive N bits of the digital data DTA into a second voltage V2.

The digital/analog converting driver 100 may further include a data dividing unit 180 that divides the digital data DTA into the M bits and the N bits and supplies the M bits and the N bits to the first converting unit 120 and the second converting unit 140, respectively.

Figure 4:
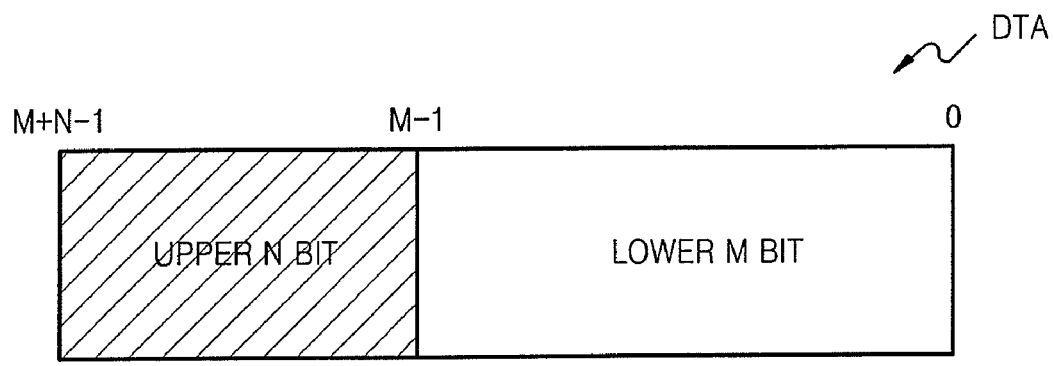
FIG. 4 conceptually illustrates the digital data in the converting driver of FIG. 3.

FIG. 4 conceptually illustrates the digital data present in the converting driver of FIG. 3.

Referring to FIG. 4, the digital data DTA is divided into two portions. The successive M bits are lower M bits DTA[M−1:0] of the digital data DTA and the successive N bits are upper N bits DTA[M+N−1:M−1] of the digital data OTA.

In other words, the first converting unit 120 converts the lower M bits DTA[M−1:0] of the digital data DTA and the second converting unit 140 converts the upper N bits DTA [M+N−1:M−1] of the digital data DTA.

Referring back to FIG. 3, the first converting unit 120 and the second converting unit 140 may be different kinds of digital/analog converters. The analog voltage outputting unit 160 adds the first voltage V1 and the second voltage V2 and outputs the added voltage as an analog voltage VANL.

Figure 5:
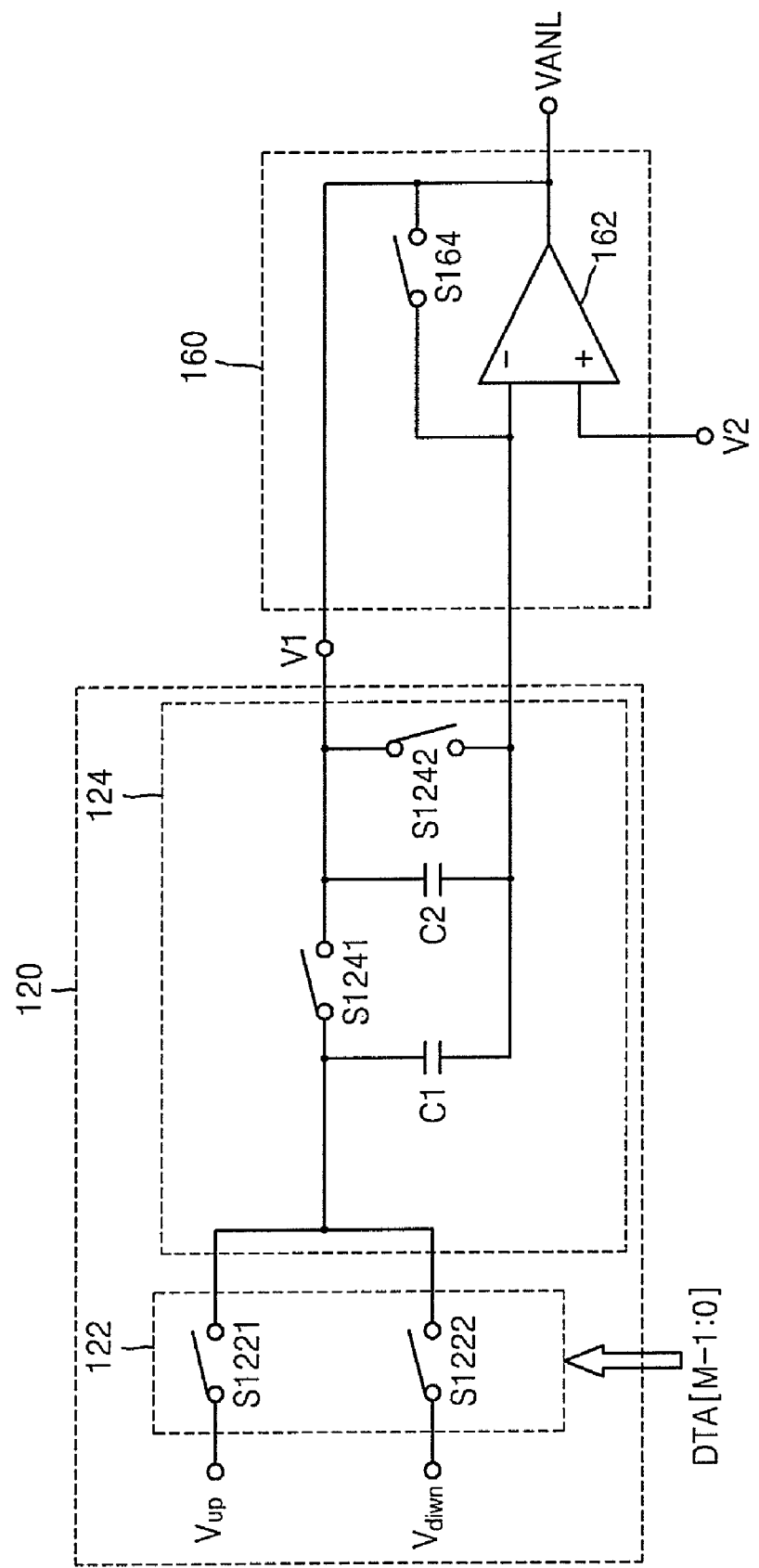
FIG. 5 is a circuit diagram illustrating a first converting unit and an analog voltage outputting unit used in the converting driver illustrated in FIG. 3.

FIG. 5 is a circuit diagram illustrating the first converting unit and the analog voltage outputting unit present in the converting driver illustrated in FIG. 3.

Referring to FIGS. 4 and 5, the first converting unit 120 is a capacitor converter. The capacitor converter 120 includes an inputting unit 122 and a converting unit 124.

The inputting unit 122 includes switches S1221 and S1222 and outputs an upper reference voltage Vup or a lower reference voltage Vdown according to the logical level "0" or "1" of each bit of the lower M bits DTA[M−1:0] of the digital data DTA.

Figure 6:
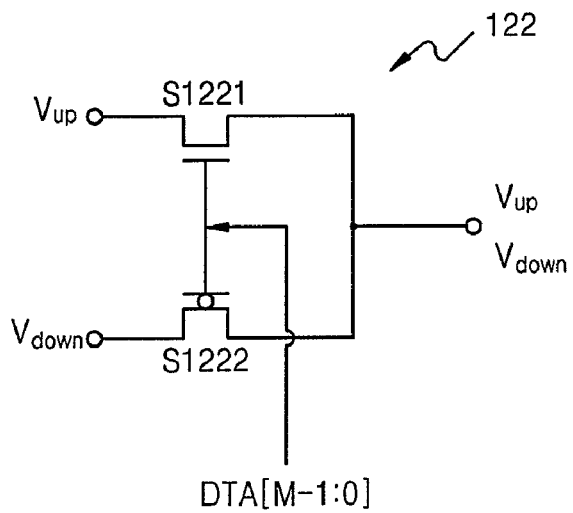
FIG. 6 is a circuit diagram illustrating an inputting unit shown in FIG. 5.

FIG. 6 is a circuit diagram illustrating the inputting unit 122 illustrated in FIG. 5.

Referring to FIG. 6, the reference voltages Vup and Vdown are applied across the inputting unit 122. The switches S1221 and S1222 of the inputting unit 122 are an NMOS transistor S1221 and a PMOS transistor S1222, respectively.

When the input bit value is a logical level "1", the NMOS transistor S1221 is turned on and, thus, the upper reference voltage Vup is supplied to the converting unit 124. When the input bit value is a logical level "0", the PMOS transistor S1222 is turned on and, thus, the lower reference voltage Vdown is supplied to the converting unit 124.

Referring back to FIG. 5, the converting unit 124 includes a first capacitor C1, a second capacitor 2, and a switch S1241. The converting unit 124 repeatedly performs charging and charge distributing operations using the upper or lower reference voltage Vup or Vdown supplied from the inputting unit 122 in order to output the first voltage V1.

The converting unit 124 operates as follows. When the upper or lower reference voltage Vup or Vdown is supplied from the inputting unit 122, the first capacitor C1 is charged by the upper or lower reference voltage Vup or Vdown.

When the input bit value is the logical level "0", the first capacitor C1 is charged by the lower reference voltage Vdown. When the input bit value is the logical level "1", the first capacitor C1 is charged by the upper reference voltage Vup.

The second capacitor C2 becomes connected to the first capacitor C1 upon the occurrence of a specific control signal (not shown). The control signal is generated by inputting the lower M bits DTA[M−1:0] of the digital data DTA to the inputting unit 122. This control signal controls switch S1241.

Then, charges are distributed from the first capacitor C1 to the second capacitor C2 upon closing switch S1241 in response to the control signal fed thereto. When the capacitance of the first capacitor C1 is equal to that of the second capacitor C2, the same amount of charges are stored in the first capacitor C1 as in the second capacitor C2.

When the above process is repeatedly performed, the amount of the charges stored in the second capacitor C2 increases or decreases according to the logical level of each bit of the input lower M bits DTA[M−1:0]. When the above process is repeatedly performed M times, the second capacitor C2 is charged by a voltage corresponding to the lower M bits DTA[M−1:0].

As the result the first voltage V1 is generated according to the amount of the charges stored in the second capacitor C2.

The capacitor converter 120 may further include a switch S1242 that is connected in parallel with the second capacitor C2 and that discharges and initializes the first capacitor C1 and the second capacitor C2.

Referring to FIG. 5, the analog voltage outputting unit 160 is a buffer. The buffer 160 includes an operational amplifier 162 and a switch S164. The operational amplifier 162 includes an inverting terminal connected to one end of the second capacitor C2 and a non-inverting terminal that receives a voltage V2, and outputs the analog voltage VANL through an output terminal connected to the other end of the second capacitor C2.

The switch S164 is connected between the non-inverting terminal and the output terminal of the operational amplifier 162. The switch S164 is turned on so that the inverting terminal voltage of the operational amplifier 162 is initialized to the non-inverting terminal voltage, that is the second voltage V2. Thereafter when the switch S164 is turned off in response to the control signal, the first voltage V1 is applied to the inverting terminal.

Accordingly, the analog voltage outputting unit 160 outputs the analog voltage VANL that is the sum of the first voltage V1 and the second voltage V2.

Figure 7:
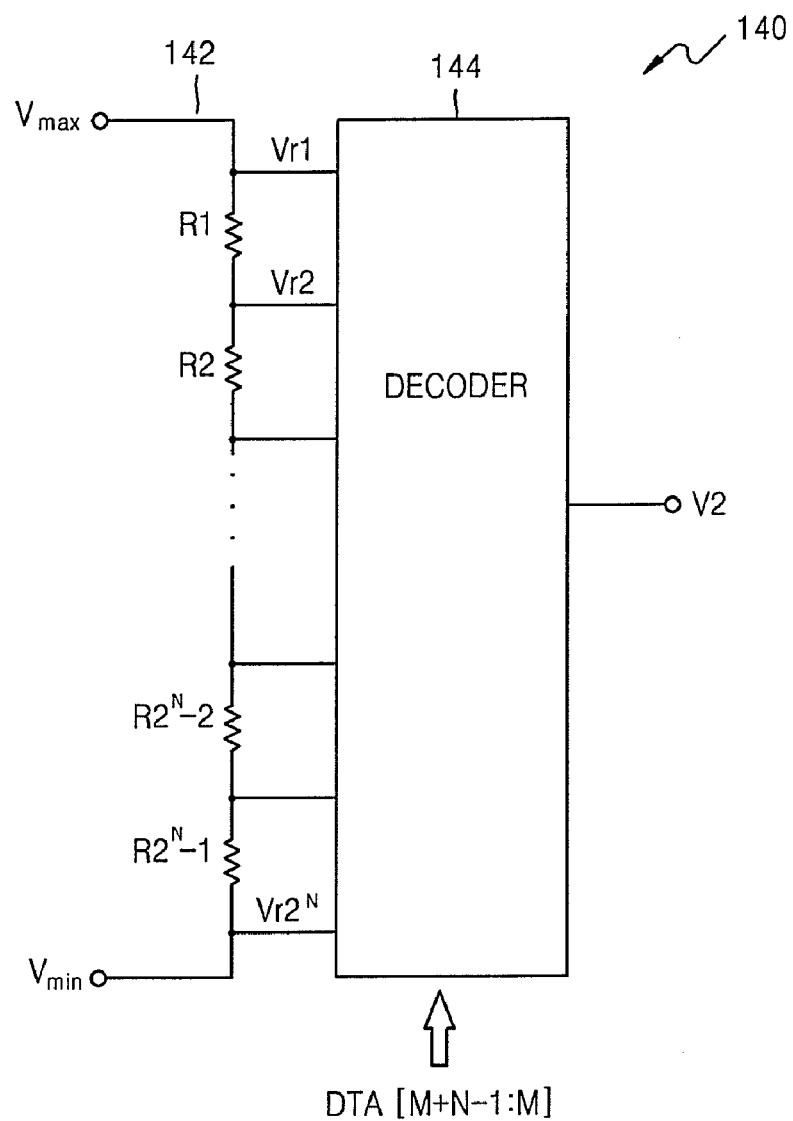
FIG. 7 illustrates a second converting unit used in the converting driver illustrated in FIG. 3.

FIG. 7 illustrates the second converting unit illustrated in FIG. 3.

Referring to FIG. 7, the second converting unit 140 is a resistor string converter. The resistor string converter 140 includes a resistor string 142 and a decoder 144.

As described above, the resistor string converter 140 converts the upper N bits DTA[M+N−1:M−1] of the digital data DTA. The resistor string 142 includes $2^N$ resistors connected in series, and a maximum voltage $V_{max}$ and a minimum voltage $V_{min}$ in the output range of the second voltage V2 are applied across the resistor string 142.

In the resistor string 142, the $2^N$ resistors R1, R2, ..., and R$2^N$−1 are arranged in series and have reference voltages Vr1, V2r, ..., and Vr$2^N$ across them, respectively. The decoder 144 selects one of the reference voltages Vr1, V2r, ..., and Vr$2^N$.

At this time, since $2^N$ voltage levels are necessary for converting the upper N bits, the reference voltages of the resistor string converter 140 are multiples of a value obtained by dividing a difference ($V_{max}-V_{min}$) between the maximum voltage $V_{max}$ and the minimum voltage $V_{min}$ by $2^N$.

When the resistor string converter 140 receives the upper N bits DTA[M+N−1:M−1] of the digital data DTA, the decoder 144 outputs a reference voltage according to each of the upper N bits DTA[M+N−1:M−1] as the second voltage V2.

Referring to FIGS. 5 and 7, the difference Vup−Vdown between the upper and lower reference voltages of the capacitor converter 120 is the same as the difference, for example, Vr1−Vr2, between the adjacent reference voltages of the resistor string converter 140.

The output ranges of the first voltage V1 and the second voltage V2 are different from each other. In particular, the output range of the first voltage V1 may be smaller than that of the second voltage V2. For example, the first voltage V1 may have the voltage level in the output range of 5 mV, and the second voltage V2 may have the voltage level in the output range of 5 V.

Referring back to FIG. 3, in the digital/analog converting driver 100, the number corresponding to M+N indicates the number of bits of the digital data DTA. At this time, the ratio of M to N may be determined to an adequate value according to the area of the driver or an error rate necessary for the system.

For example, when M+N, that is, the bit number of the digital data DTA is 10, M is 7 and N is 3, and, when M+N is 12, M is 8 and N is 4.

Suppose that the error rate of the capacitor converter unit in the 10-bit or 12-bit system is 1. The above examples are selected in order to reduce the error rate to about 10% when converting the 10-bit or 12-bit digital data by the digital/analog converting driver according to an exemplary embodiment of the present embodiment.

Accordingly, when M+N is 10, M may be smaller than 7 and, when M+N is 12, M may be smaller than 8. When M becomes smaller than a predetermined number, however, the number of the upper N bits that will be processed in the resistor string converter increases.

Thus, M and N must be determined in consideration of the principle that the area of the digital/analog converting driver increases as the value of M decreases.

When M and N are determined to be the above values, the area of the converter according to the exemplary embodiment is about a half of that of the conventional resistor string converter of the 8-bit system. Furthermore, since a most significant bit that can generate a largest error is converted by the resistor string converter, the stability of the system is greatly improved.

Figure 8:
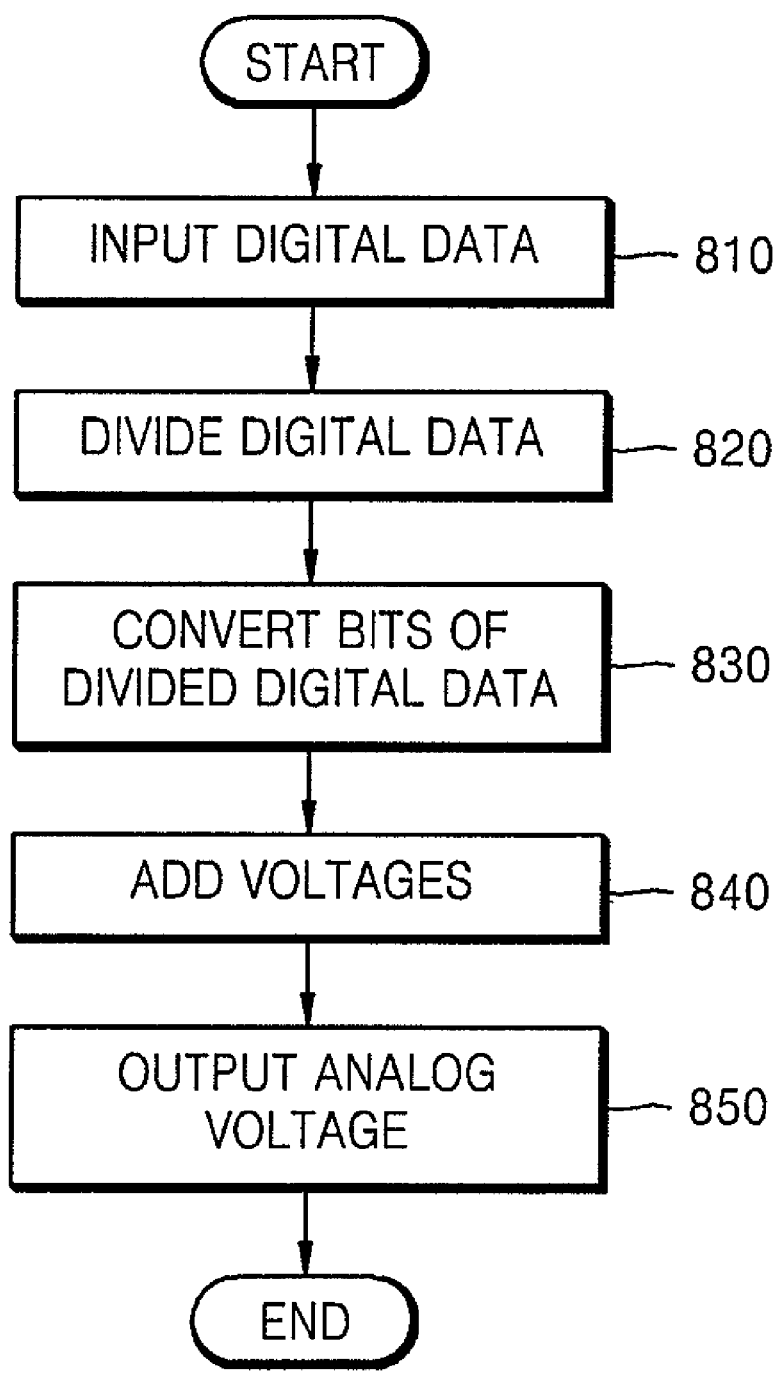
FIG. 8 is a flowchart illustrating a digital/analog converting method according to an exemplary embodiment of the present invention.

FIG. 8 is a flowchart illustrating a digital/analog converting method according to an exemplary embodiment of the present invention.

Referring to FIG. 8, the digital/analog converting method according to the exemplary embodiment includes operation 810 for inputting digital data having M+N bits to the digital/analog converting driver, operation 820 for dividing the digital data by a predetermined number, operation 830 for digital/analog converting the bits of the divided digital data and outputting voltages corresponding to the divided bits, operation 840 for adding the voltages obtained by performing the conversion, and operation 850 for outputting the added voltage as an analog voltage.

The digital/analog converting method according to the exemplary embodiment has the same technical spirit as that of the digital/analog converting driver and corresponds to the operation of the digital/analog converting driver described above. Accordingly, the digital/analog converting method according to the exemplary embodiment can be easily understood from the above description by those of ordinary skill in the art and, thus, their description will be omitted.

Figure 9:
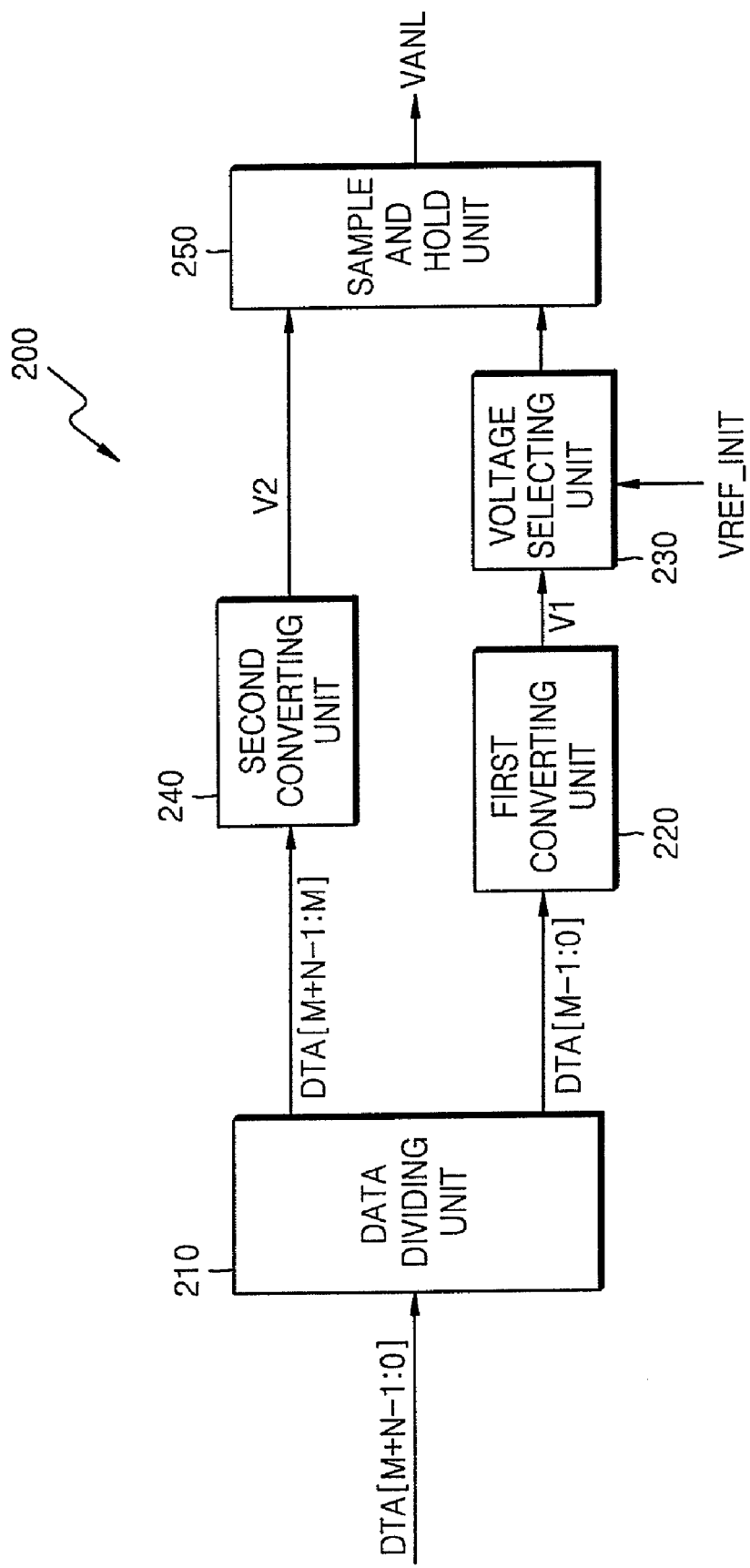
FIG. 9 is a block diagram illustrating a digital/analog converting driver according to an exemplary embodiment of the present invention.

FIG. 9 is a block diagram illustrating a digital/analog converting driver according to an exemplary embodiment of the present invention.

Referring to FIG. 9, the digital/analog converting driver according to the present embodiment receives digital data DTA having M+N bits (M and N are integers) and converts the digital data DTA into an analog voltage VANL, and includes a first converting unit 220, a second converting unit 240, and a sample-and-hold unit 250.

The first converting unit 220 converts M bits of the digital data DTA fed in through a data dividing unit 210 into a first voltage V1. The second converting unit 240 converts N bits of the digital data DTA into a second voltage V2.

The sample-and-hold unit 250 samples the second voltage V2 in a sample mode and outputs the analog voltage VANL by adding the first voltage V1 and the second voltage V2 in a hold mode. In the sample mode, the sample-and-hold unit 250 receives an initial reference voltage VREF_INIT through the voltage selecting unit 230 and samples the second voltage V2 in the sample mode. In the hold mode, the sample-and-hold unit 250 receives the first voltage V1 and adds the second voltage V2 and the first voltage V1 thereby outputting the analog voltage VANL.

The initial reference voltage VREF_INIT and the first voltage VA have different voltage levels. Thus, the sample-and-hold unit 250 in the digital/analog converting driver 200 according to the exemplary embodiment performs a sample-and-hold function using the different voltages in the sample mode and the hold mode.

The digital/analog converting driver 200 further includes the voltage selecting unit 230. The voltage selecting unit 230 receives the first voltage V1 from the first converting unit 220 and selectively outputs the initial reference VREF_INIT or the first voltage V1 to the sample-and-hold unit 250.

The digital/analog converting driver 200 further includes the data dividing unit 210 that divides the digital data DTA into M bits and N bits and supplies the M bits and the N bits to the first converting unit 220 and the second converting unit 240, respectively.

Figure 10:
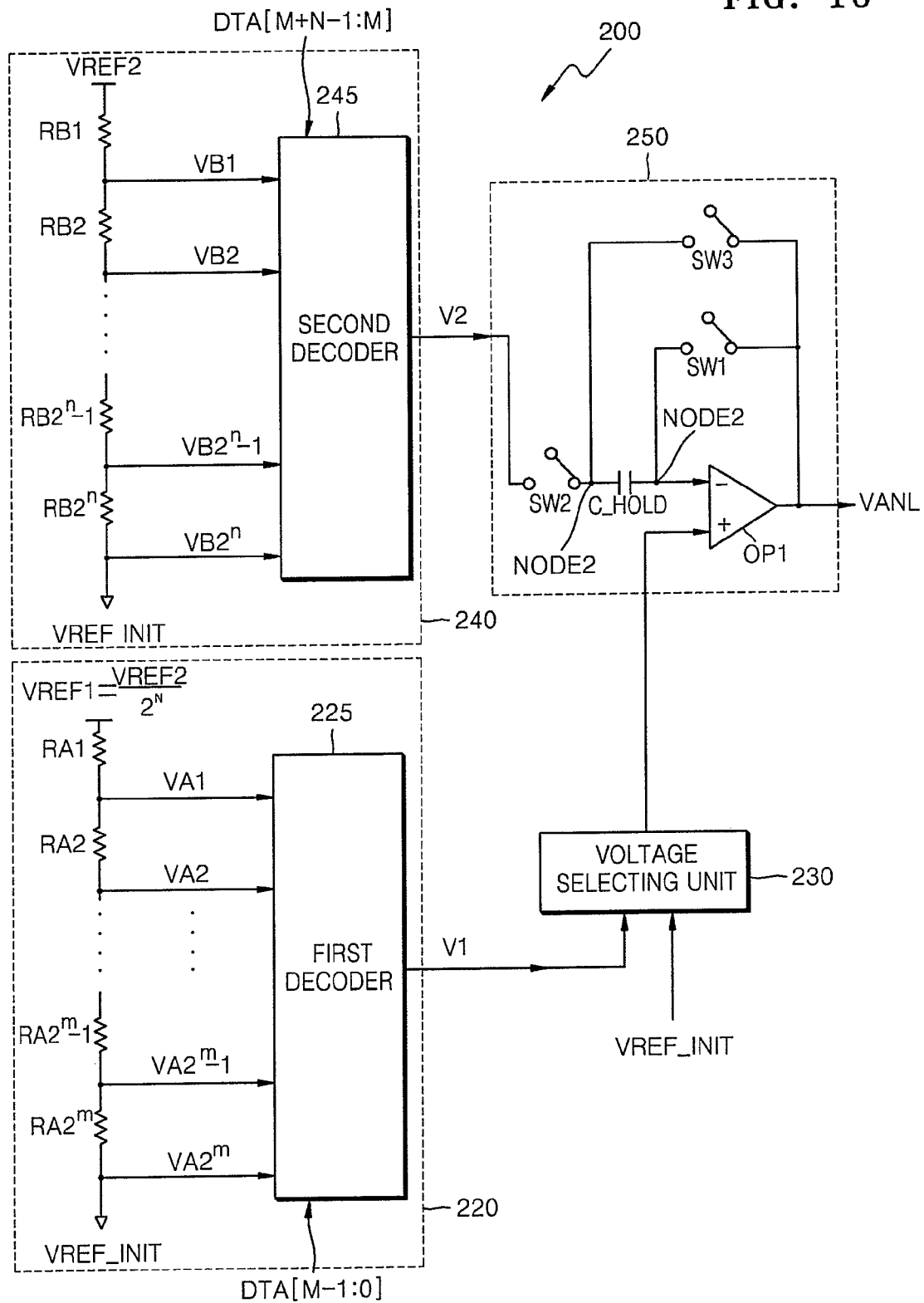
FIG. 10 is a circuit diagram illustrating the digital/analog converting driver illustrated in FIG. 9.

FIG. 10 is a circuit diagram illustrating portions of the digital/analog converting driver according to the exemplary embodiment shown in FIG. 9.

Referring to FIG. 10, the first converting unit 220 is a resistor string converter that includes a plurality of resistors RA1 to RA2$^M$ that are connected to one another in series and a first decoder 225. The second converting unit 240 is a resistor string converter that includes a plurality of resistors RB1 to RB2$^N$ that are connected to one another in series and a second decoder 245.

The plurality of resistors RA1 to RA2$^M$ of the first converting unit 220 are connected to one another in series between a first reference voltage VREF1 and the initial reference voltage VREF_INIT. Furthermore, the plurality of resistors RB1 to RB2$^N$ of the second converting unit 240 are connected to one another in series between a second reference voltage VREF2 and the initial reference voltage VREF_INIT. The second reference voltage VREF2 is 2$^N$ times the first reference voltage VREF1.

The initial reference voltage VREF_INIT indicates a predetermined reference voltage and may be a ground voltage. For convenience sake, supposing that the initial reference voltage VREF_INIT is the ground voltage, the operation of the digital/analog converting driver 200 will be described.

The plurality of resistors RA1 to RA2$^M$ of the first converting unit 220 may all have the same resistance value. The plurality of resistors RB1 to RB2$^N$ of the second converting unit 240 may also all have the same resistance value.

The resistor string of the first converting unit 220 outputs 2$^M$ voltages VA1 to VA2$^M$ through nodes between the plurality of resistors RA1 to RA2$^M$. The 2$^M$ voltages VA1 to VA2$^M$ are divided voltages between the first reference voltage VREF1 and the initial reference voltage VREF_INIT. The first decoder 225 selects and outputs a voltage corresponding to the lower M bits DTA[M−1:0] of the digital data DTA from the 2$^M$ voltages VA1 to VA2$^M$. Accordingly, the first converting unit 220 converts the lower M bits DTA[M−1:0] of the digital data DTA into the first voltage V1.

The resistor string of the second converting unit 240 outputs 2$^N$ voltages VB1 to VB2$^N$ through nodes between the plurality of resistors RB1 to RB2$^N$. The 2$^N$ voltages VB1 to VB2$^N$ are divided voltages between the second reference voltage VREF2 and the initial reference voltage VREF_INIT. The second decoder 245 selects and outputs a voltage corresponding to the upper N bits DTA[M+N−1:M−1] of the digital data DTA from the 2$^N$ voltages VB1 to VB2$^N$. Accordingly, the second converting unit 240 converts the upper N bits DTA[M+N−1:M−1] of the digital data DTA into the second voltage V2.

Referring to FIG. 10, an interval, for example VA1-VA2, between the adjacent voltage levels of the first voltage V1 of the first converting unit 220 may be VREF1/$2^M$. An interval for example, VB1-VB2, between the adjacent voltage levels of the second voltage V2 of the second converting unit 240 may be VREF2/$2^N$.

Accordingly, the interval between the voltage levels of the first voltage V1 is different from the interval between the voltage levels of the second voltage V2. More specifically, the interval between the voltage levels of the first voltage V1 may be smaller than the interval between the voltage levels of the second voltage V2.

The second converting unit 240 converts the upper N bits DTA[M+N−1:M] of the digital data DTA into the second voltage V2 having a relatively large voltage level interval and the first converting unit 220 converts the lower M bits DTA[M−1:0] of the digital data DTA into the first voltage V1 having a relatively small voltage level interval.

The analog voltage VANL output from the digital/analog converter 200 has a resolution that corresponds to the interval between the voltage levels of the first voltage V1.

Furthermore, the second reference voltage VREF2 may be $2^N$ times the first reference voltage VREF1. In this case, the interval between the adjacent voltage levels of the second voltage V2 is the same as the first reference voltage VREF1 of the first converting unit 220.

Referring back to FIG. 10, the voltage selecting unit 230 selectively outputs the first voltage V1 or the initial reference voltage VREF_INIT to the sample-and-hold unit 250. The voltage selecting unit 230 outputs the initial reference voltage VREF_INIT in the sample mode and outputs the first voltage V1 in the hold mode.

The sample-and-hold unit 250 includes an operational amplifier OP1, a holding capacitor C_HOLD, a first switch SW1, a second switch SW2, and a third switch SW3. The sample-and-hold unit 250 operates in the sample mode and the hold mode. Hereinafter, the operation of the sample-and-hold unit 250 in each mode will be described in detail.

FIG. 11 illustrates an operation of the sample-and-hold unit shown in FIG. 10.

Figure 11A:
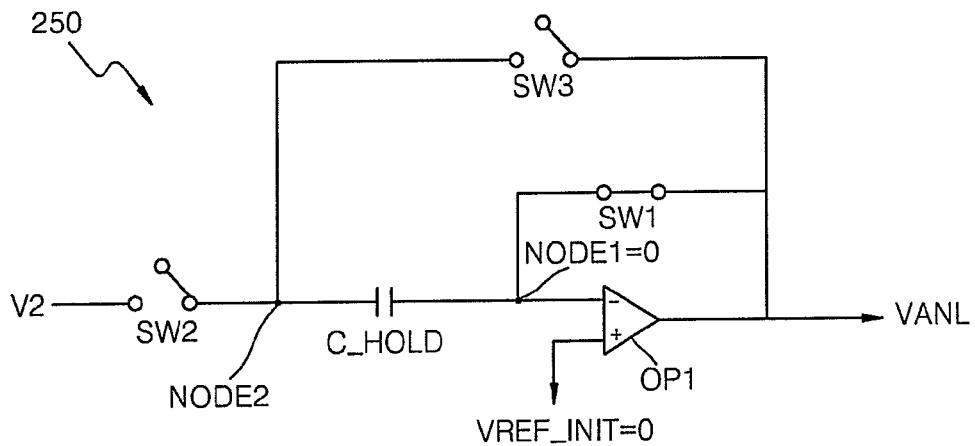
FIGS. 11A-11C illustrate an operation of a sample-and-hold unit used in the converting driver illustrated in FIG. 10.
Figure 11B:
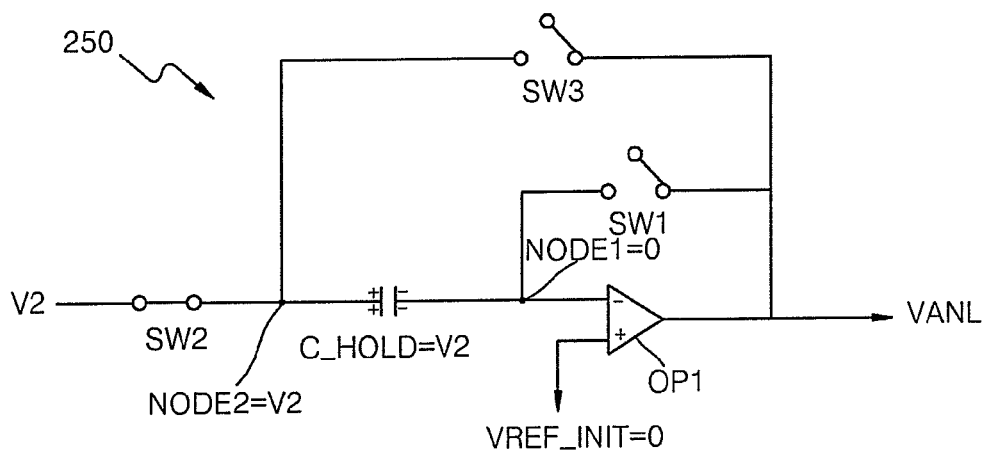

FIG. 11A illustrates an operation of the sample-and-hold unit in a reset mode, FIG. 11B illustrates an operation of the sample-and-hold unit in the sample mode, and FIG. 11B illustrates an operation of the sample-and-hold unit in the hold mode.

Hereinafter, for convenience sake, assuming that the initial reference voltage VREF_INIT is a ground voltage, the operation of the sample-and-hold unit will be described.

Referring to FIG. 11A, in the reset mode, the initial reference voltage VREF_INIT is input to the non-inverting terminal of the operational amplifier OP1 and the first switch SW1 is closed. Then, the voltage of the first node NODE1 connected to the inverting terminal of the operational amplifier OP1 becomes 0.

Referring to FIG. 11B, in the sample mode, the initial reference voltage VREF_INIT is input to the non-inverting terminal of the operational amplifier OP1. The first switch SW1 is opened and the second switch SW2 is closed. Then, the voltage of the second node NODE2 becomes the second voltage V2 and the holding capacitor C_HOLD is charged to the second voltage V2.

Figure 11C:
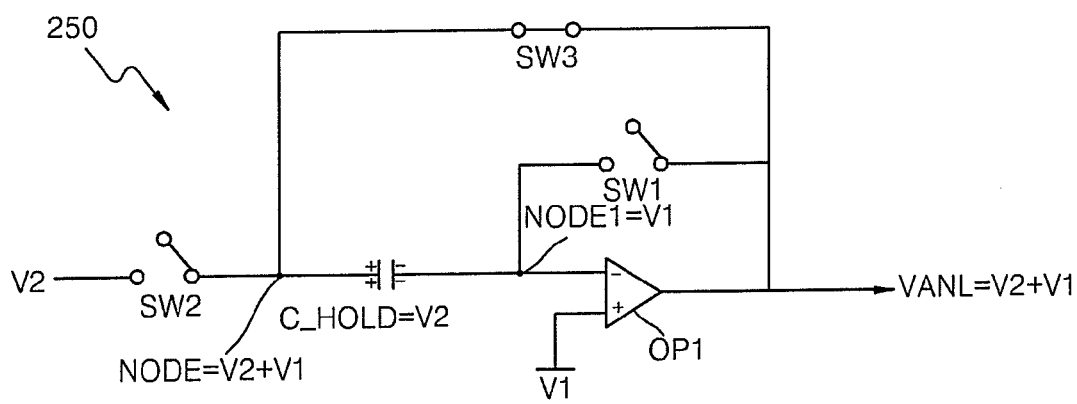

Referring to FIG. 11C, in the hold mode, the first voltage V1 is input to the non-inverting terminal of the operational amplifier OP1. The second switch SW2 is opened and the third switch SW3 is closed. Then, the voltage of the first node NODE1 becomes the first voltage V1 and, thus, the voltage of the second node NODE2 becomes the sum of the first voltage V1 and the second voltage V2. Since the analog voltage VANL is the same as the voltage of the second node NODE2, the analog voltage VANL also becomes the sum of the first voltage V1 and the second voltage V2.

The initial reference voltage VREF and the first voltage V1 are different from each other. Accordingly, the sample-and-hold unit 250 of the digital/analog converting driver 200 according to the exemplary embodiment performs the sample-and-hold function using the different voltages in the sample mode and the hold mode. In other words, in the sample modes the sample-and-hold unit 250 receives the initial reference voltage VREF_INIT and outputs the second voltage V2 having a large voltage level interval. In the hold mode, the sample-and-hold unit 250 receives the first voltage V1 and outputs the sum of the first voltage V1 having a small voltage level interval and the second voltage V2.

The digital/analog converting driver 200 according to the exemplary embodiment can output the analog voltage having the same resolution as that of the digital/analog converter 100, while occupying a smaller circuit area than that of the digital/analog converter 100.

Referring to FIG. 1, the digital/analog converter 100 includes $2^K$ resistors and an interval between the voltage levels of the output voltage $Vo_1, Vo_2, \ldots, Vo_k$ is $(V_{max}-V_{min})/2^K$.

Referring to FIG. 10, the digital/analog converting driver 200 according to the exemplary embodiment includes $2^M+2^N$ resistors and an interval between the voltage levels of the output analog voltage VANL is VREF1/$2^M$. When the second reference voltage VREF2 is $2^N$ times of the first reference voltage VREF1 (VREF1=VREF2/$2^N$), the interval between the voltage levels of the first voltage V1 is VREF1/$2^M$=VREF2/$2^{M+N}$. Accordingly, the interval between the voltage levels of the analog voltage VANL becomes VREF2/$2^{N+M}$.

More specifically, in FIG. 10, supposing that VREF2=VREF and N=M=K/2, the digital/analog converting driver 200 includes $2^{K/2}+2^{K/2}=2^{(k/2+1)}$. Furthermore the interval between the voltage levels of the analog voltage VANL becomes VREF/$2^K$.

Accordingly, the digital/analog converting driver 200 includes the smaller number of the resistors than the resistors in the digital/analog converter 100 by $2^K-2^{(k/2+1)}$ and has the same resolution as that of VREF/$2^K$.

FIG. 12 is a flowchart illustrating a digital/analog converting method according to an exemplary embodiment of the present invention.

Referring to FIG. 12, the digital/analog converting method 600 according to the exemplary embodiment converts digital data having M+N (M and N are integers) bits into an analog voltage and includes a digital data converting operation 610 and sample and hold operations 620 and 630.

The digital data converting operation 610 includes a first converting operation for converting the M bits of the digital data into a first voltage and a second converting operation for converting the N bits of the digital data into a second voltage.

The sample and hold operations 620 and 630 include a sample operation and a hold operation, respectively. In the sample operation 620, an initial voltage is input and the second voltage is sampled. In the hold operation 630, the first voltage is input and the sum of the first voltage and the second voltage is output as the analog voltage.

The digital/analog converting method 600 according to the exemplary embodiment has the same technical spirit as that of the digital/analog converting driver 200 and corresponds to the operation of the digital/analog converting driver 200. Accordingly, the digital/analog converting method 600 according to the exemplary embodiment can be easily understood from the above description by those of ordinary skill in the art and, thus a description thereof will be omitted.

As described above, by using the digital/analog converting device and the digital/analog converting method according to exemplary embodiments of the present invention, it is possible to reduce the area of the converter while maintaining the same resolution as that of a general digital/analog converter.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A digital/analog converting driver that converts digital data having M+N bits, where M and N are integers, into an analog voltage, comprising:
    a first converting unit that converts successive M bits of the digital data into a first voltage;
    a second converting unit that converts successive N bits of the digital data into a second voltage; and
    an analog voltage outputting unit that adds the first voltage and the second voltage and outputs the added voltage as the analog voltage,
    wherein an output range of the first voltage is different from an output range of the second voltage, and
    wherein the first converting unit is a capacitor converter using charging and dividing operations of capacitors and the second converting unit is a resistor string converter.

2. The digital/analog converting driver of claim 1, wherein the M bits are lower M bits of the digital data, and the N bits are upper N bits of the digital data.

3. The digital/analog converting driver of claim 1, wherein the output range of the first voyage is smaller than the output range of the second voltage.

4. The digital/analog converting driver of claim 1, wherein the capacitor converter comprises:
    an inputting unit that includes switches and outputs a upper or lower reference voltage corresponding to the logical level of the successive M bits of the digital data; and
    a converting unit that includes a first capacitor, a second capacitor, and switches, and outputs the first voltage by performing charging and dividing operations on inputs received from the inputting unit,
    wherein the resistor string converter comprises:
    a resistor string that includes a plurality of resistors connected in series and having respective reference voltages; and
    a decoder that outputs one of the reference voltages corresponding to the successive N bits of the digital data as the second voltage.

5. The digital/analog converting driver of claim 4, wherein a difference between the upper and lower reference voltages of the capacitor converter is the same as a difference between the adjacent reference voltages of the resistor string converter.

6. The digital/analog converting driver of claim 4, wherein the first capacitor and the second capacitor have the same capacitance.

7. The digital/analog converting driver of claim 4, wherein the resistor string comprises $2^N$ resistors.

8. The digital/analog converting driver of claim 1, wherein the analog voltage outputting unit is a buffer.

9. The digital/analog converting driver of claim 8, wherein the buffer comprises:
    an operational amplifier that includes an inverting terminal connected to one end of the second capacitor and a non-inverting terminal that receives the second voltage, and an output terminal connected to the other end of the second capacitor and outputs the analog voltage; and
    a switch connected to the output terminal and the inverting terminal of the operational amplifier.

10. The digital/analog converting driver of claim 1, wherein, when M+N is 10, M is 7 and N is 3.

11. The digital/analog converting driver of claim 1, wherein, when M+N is 12, M is 8 and N is 4.

12. The digital/analog converting driver of claim 1, further comprising a data dividing unit that divides the digital data into the M bits and the N bits and supplies the M bits and the N bits to the first converting unit and the second converting unit, respectively.

13. A digital/analog converting method comprising:
    inputting digital data having M+N bits to a digital/analog converting driver;
    dividing the digital data by the M bits and the N bits;
    converting the M bits and the N bits into corresponding voltages;
    wherein the M bits are converted by a capacitor using charging and dividing operations of capacitors and the N bits are converted by a resistor string;
    adding the voltages; and
    outputting the added voltage as an analog voltage.

14. The digital/analog converting method of claim 13, wherein the M bits are lower M bits of the digital data and the N bits are upper N bits of the digital data.

15. The digital/analog converting method of claim 14, wherein, in the converting of the bits, output ranges of the voltages corresponding to the M bits and the N bits are different from one another.

16. The digital/analog converting method of claim 15, wherein, in the converting of the bits, the output range of the voltages corresponding to the M bits is smaller than the output range of the voltages corresponding to the N bits.

17. The digital/analog converting method of claim 13, wherein M is 7 and N is 3.

18. The digital/analog converting method of claim 13, wherein M is 8 and N is 4.

19. A digital/analog converting driver that converts digital data having M+N bits, where M and N are integers, into an analog voltage, comprising:
    a first converting unit that converts M bits of the digital data into a first voltage;
    a second converting unit that converts N bits of the digital data into a second voltage; and
    a sample-and-hold unit which samples the second voltage in a sample mode, and outputs the analog voltage by adding the first voltage and the second voltage in a hold mode.

20. The digital/analog converting driver of claim 19, wherein the sample-and-hold unit receives an initial reference voltage and samples the second voltage in the sample mode,
    wherein the sample-and-hold unit receives the first voltage and outputs the analog voltage in the hold mode, and
    wherein the initial reference voltage and the first voltage have different voltage levels.

21. The digital/analog converting driver of claim 20, further comprising a voltage selecting unit that receives the first voltage from the first converting unit and selectively outputs the initial reference voltage or the first voltage to the sample-and-hold unit.

22. The digital/analog converting driver of claim 21, wherein the first converting unit and the second converting unit are resistor swing converters that include a plurality of resistors connected in series.

23. The digital/analog converting driver of claim 22, wherein the first converting unit includes $2^M$ resistors connected in series between the first reference voltage and the initial reference voltage, wherein the second converting unit includes $2^N$ resistors connected in series between the second reference voltage and the initial reference voltage, and wherein the second reference voltage is $2^N$ times of the first reference voltage.

24. The digital/analog converting driver of claim 23, wherein the resistors of the first converting unit have the same resistance and the resistors of the second converting unit have the same resistance.

25. The digital/analog converting driver of claim 19, wherein an interval between the voltage levels of the first voltage is different from an interval between the voltage levels of the second voltage.

26. The digital/analog converting driver of claim 25, wherein the interval between the voltage levels of the first voltage is smaller than the interval between the voltage levels of the second voltage.

27. The digital/analog converting driver of claim 25, wherein the M bits are lower M bits of the digital data and the N bits are upper N bits of the digital data.

* * * * *